(12) United States Patent
Nakagawa et al.

(10) Patent No.: US 9,341,797 B2
(45) Date of Patent: May 17, 2016

(54) OPTICAL MODULE AND METHOD FOR MANUFACTURING OPTICAL MODULE

(71) Applicant: International Business Machines Corporation, Armonk, NY (US)

(72) Inventors: Shigeru Nakagawa, Tokyo (JP); Yoichi Taira, Tokyo (JP); Masao Tokunari, Kanagawa (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/483,596

(22) Filed: Sep. 11, 2014

(65) Prior Publication Data
US 2015/0104129 A1 Apr. 16, 2015

(30) Foreign Application Priority Data

Oct. 11, 2013 (JP) .................................. 2013-213744

(51) Int. Cl.
*G02B 6/12* (2006.01)
*G02B 6/43* (2006.01)
(Continued)

(52) U.S. Cl.
CPC .............. *G02B 6/43* (2013.01); *G02B 6/12007* (2013.01); *G02B 6/42* (2013.01); *H04B 10/40* (2013.01); *G02B 6/132* (2013.01); *G02B 6/136* (2013.01); *G02B 6/4214* (2013.01); *G02B 6/4215* (2013.01)

(58) Field of Classification Search
CPC .......... G02B 6/43; G02B 6/42; G02B 6/3512; H01L 25/167; H01L 31/0547
USPC .................... 385/14, 88–92; 438/25
See application file for complete search history.

(56) References Cited

U.S. PATENT DOCUMENTS 6,475,557 B1 * 11/2002 Mori et al. ..................... 427/162
6,811,853 B1 * 11/2004 Sherrer et al. ................ 428/138
(Continued)

FOREIGN PATENT DOCUMENTS

JP  08046593 A  2/1996
JP  11054785 A  2/1996
(Continued)

OTHER PUBLICATIONS

Lemoff et al., "500-Gbps Parallel-WDM Optical Interconnect", Proceedings Electronic Components and Technology Conference, 2005, pp. 1027-1031.

*Primary Examiner* — Ellen Kim
(74) *Attorney, Agent, or Firm* — Walter L. Rudberg; Maeve L. McCarthy

(57) ABSTRACT

An optical module includes: at least one optical waveguide provided on a surface of a substrate; a plurality of grooves provided in the optical waveguide on the surface of the substrate and having both a surface orthogonal to the surface of the substrate and an inclined surface; multiple pairs of light-emitting and light-receiving elements aligned with the plurality of grooves in the optical waveguide and provided so as to correspond to light of different wavelengths on the optical waveguide; and a plurality of light-selecting filters each provided on an inclined surface of the plurality of grooves in the optical waveguide and reflecting light of the wavelength corresponding to the light-emitting element in the respective pair of light-emitting and light-receiving elements towards the optical waveguide, and selectively reflecting light of the corresponding wavelength from the light propagating through the optical waveguide towards the corresponding pair of light-emitting and light-receiving elements.

20 Claims, 10 Drawing Sheets

(51) Int. Cl.
*H04B 10/40* (2013.01)
*G02B 6/42* (2006.01)
*G02B 6/132* (2006.01)
*G02B 6/136* (2006.01)

(56) References Cited

U.S. PATENT DOCUMENTS

| | | | |
|---|---|---|---|
| 6,939,058 B2 * | 9/2005 | Gurevich et al. | 385/93 |
| 7,539,367 B2 * | 5/2009 | Tamura et al. | 385/14 |
| 7,729,569 B2 * | 6/2010 | Beer et al. | 385/14 |
| 8,724,944 B2 * | 5/2014 | Kuznia et al. | 385/33 |
| 2011/0188807 A1 * | 8/2011 | Fattal et al. | 385/37 |

FOREIGN PATENT DOCUMENTS

| | | |
|---|---|---|
| JP | 10335693 A | 12/1998 |
| JP | 11174253 A | 7/1999 |
| JP | 2002289904 A | 10/2002 |
| JP | 2004206057 A | 7/2004 |
| JP | 2004294996 A | 10/2004 |
| JP | 2010225824 A | 10/2010 |
| JP | 2011512641 A | 4/2011 |
| JP | 2011257476 A | 12/2011 |
| JP | 2015075734 A | 4/2015 |

* cited by examiner (A)　　　　　　　　　(B)

| Laser Wavelength | 940nm | 980nm | 1020nm | 1060nm |
|---|---|---|---|---|
| Total Loss (dB) | 1.0 | 0.9 | 0.9 | 0.6 |
| 1st Filter (dB) | 0.6 (reflection) | - | - | - |
| 2nd Filter (dB) | 0.3 (transmission) | 0.4 (reflection) | - | - |
| 3rd Filter (dB) | 0.1 (transmission) | 0.3 (transmission) | 0.4 (reflection) | - |
| 4th Filter (dB) | 0.0 (transmission) | 0.2 (transmission) | 0.5 (transmission) | 0.6 (reflection) |

| Laser Wavelength | 940nm | 980nm | 1020nm | 1060nm |
|---|---|---|---|---|
| Total Loss (dB) | 1.0 | 0.8 | 0.8 | 0.3 |
| 1st Filter (dB) | 0.3 (reflection) | - | - | - |
| 2nd Filter (dB) | 0.6 (transmission) | 0.2 (reflection) | - | - |
| 3rd Filter (dB) | 0.1 (transmission) | 0.3 (transmission) | 0.2 (reflection) | - |
| 4th Filter (dB) | 0.0 (transmission) | 0.3 (transmission) | 0.6 (transmission) | 0.3 (reflection) |

OPTICAL MODULE AND METHOD FOR MANUFACTURING OPTICAL MODULE

TECHNICAL FIELD

The present invention relates to an optical communication technique and, more specifically, to an optical module and method for manufacturing an optical module which inputs and outputs wavelength multiplexed optical signals to and from an optical waveguide.

BACKGROUND

A spatial multiplexing scheme is used in optical communication techniques such as in conventional optical multi-chip modules (MCM) to increase the number of channels and expand the signal band. Often, an array is used which includes light-emitting elements used to transmit light, such as a vertical cavity surface emitting laser (VCSEL) with 12 channels and a 250 μm pitch, and light-receiving elements used to receive light, such as photodiodes (PD). A VCSEL/PD chip is mounted on a 12-channel optical waveguide, but further densification is being considered in order to obtain a wider bandwidth, such as 24 channels and a pitch of 125 μm, and 48 channels and a pitch of 62.5 μm.

It is assumed that the optical waveguide is connected to an optical fiber. Therefore, densification is limited to a pitch of 125 μm considering the fact that the clad diameter of optical fibers currently in use is 125 μm. Even if the limitation to a 125-μm pitch were overcome by reducing the diameter of optical fibers, densification of 48 channels or more limits the optical waveguide to a single layer considering the fact that core width of multi-mode optical fibers is 35 μm and light leakage occurs. When the optical waveguide has two or more layers, the connection loss due to a wider light beam becomes a serious problem.

FIG. 1 (Prior Art) is a top view schematically illustrating a densified optical module 100 using a spatial multiplexing scheme of the prior art. A plurality of optical waveguides 110 is arranged densely on the surface of a substrate 105. A single optical input/output unit 115 embodied by a reflecting means such as a mirror inclined by 45 degrees to reflect and change light from a horizontal direction to a vertical direction is provided on one end of each optical waveguide 110, and these units are not arranged side-by-side but separated from each other by some distance. Two electric pads 120, an input pad and an output pad, are provided for each optical input/output unit 115 to complete the VCSEL/PD chip 125. When the optical waveguides 110 have a width of 35 μm and are arranged at a pitch of 62.5 μm, the space between optical waveguides 110 is 27.5 μm. Even when light leakage is taken into account, it is difficult to connect electrical wiring from the electric pads 120 in a manner that does not adversely affect the arrangement of the optical waveguides 110.

A 500-Gbps parallel wavelength division multiplexing (PWDM) optical interconnect is disclosed in Non-Patent Literature 1 (B. E. Lemoff et al., 500-Gbps Parallel-WDM Optical Interconnect, Proceedings Electronic Components and Technology Conference, Vol. 2, 2005, pp. 1027-1031) in which 10.42 Gbps, 48-channel data transmission occurs via a ribbon having twelve parallel optical fibers with four wavelengths per optical fiber. VCSELs and PDs are connected to the optical fibers using coarse wavelength division multiplexing to provide densification. However, the propagation of light is controlled in this optical interconnect by reflection alone, and there is no structure for controlling the propagation of light in the waveguides. Also, the insertion loss at both the transmitter and the receiver end (from the light-emitter or receiver to the optical fiber) is a significant 6-8 dB.

An optical receiver is described in Laid-open Patent Publication No. 2011-257476 in which a first substrate made of an optically transparent material having a plurality of light-receiving elements formed in the obverse surface and a plurality of V-shaped grooves in the reverse surface and a second substrate made of an optically transparent material having the same refractive index as the first substrate and having a plurality of protrusions with a shape corresponding to the V-shaped grooves formed on the obverse surface are integrally formed by mating the V-shaped grooves into the protrusions and bonding them together, the wavelength-multiplexed light passing through the mated V-shaped grooves and protrusions passes through a non-reflective film formed on one of the inclined surfaces of each V-shaped groove without any reflection, and only light of the corresponding wavelength is reflected by a band reflection filter formed on the other inclined surface of each V-shaped groove towards a light-receiving element via the first substrate. Because light propagates through the first substrate and the second substrate, the first substrate and the second substrate are not optical waveguides. Therefore, a non-reflective film has to be formed on one of the inclined surfaces of each V-shaped groove to propagate the light.

SUMMARY OF INVENTION

The optical module in an aspect of the present invention includes: at least one optical waveguide provided on a surface of a substrate; a plurality of grooves provided in the optical waveguide on the surface of the substrate and having both a surface orthogonal to the surface of the substrate and an inclined surface; multiple pairs of light-emitting and light-receiving elements aligned with the plurality of grooves in the optical waveguide and provided so as to correspond to light of different wavelengths on the optical waveguide; and a plurality of light-selecting filters each provided on an inclined surface of the plurality of grooves in the optical waveguide and reflecting light of the wavelength corresponding to the light-emitting element in the respective pair of light-emitting and light-receiving elements towards the optical waveguide, and selectively reflecting light of the corresponding wavelength from the light propagating through the optical waveguide towards the corresponding pair of light-emitting and light-receiving elements.

A method for manufacturing an optical module in another aspect of the present invention includes: forming a plurality of grooves in at least one optical waveguide provided on a surface of a substrate, each groove having a surface orthogonal with respect to and a surface inclined with respect to the surface of the substrate; and forming a plurality of light-selecting filters for reflecting light of a wavelength corresponding to light of different wavelengths on the corresponding inclined surfaces of the plurality of grooves.

DETAILED DESCRIPTION

The following is an explanation of the present invention with reference to an embodiment of the present invention. However, the present embodiment does not limit the present invention in the scope of the claims. Also, all combinations of characteristics explained in the embodiment are not necessarily required in the technical solution of the present invention. Furthermore, the present invention can be implemented in many different embodiments, and it should be construed that the present invention is not limited to the following description of embodiments. Throughout the entire explanation of the embodiment, identical configurational portions and elements are denoted by the same reference numbers.

Embodiments of the present invention recognize that it is an object of the present invention to realize an optical communication technique able to overcome the channel density limitations of the spatial multiplexing scheme, thereby increasing the number of channels and improving densification. Embodiments of the present invention recognize that the object of the present invention includes providing an optical module and method for manufacturing an optical module which inputs and outputs wavelength multiplexed optical signals to and from an optical waveguide.

Figure 1:
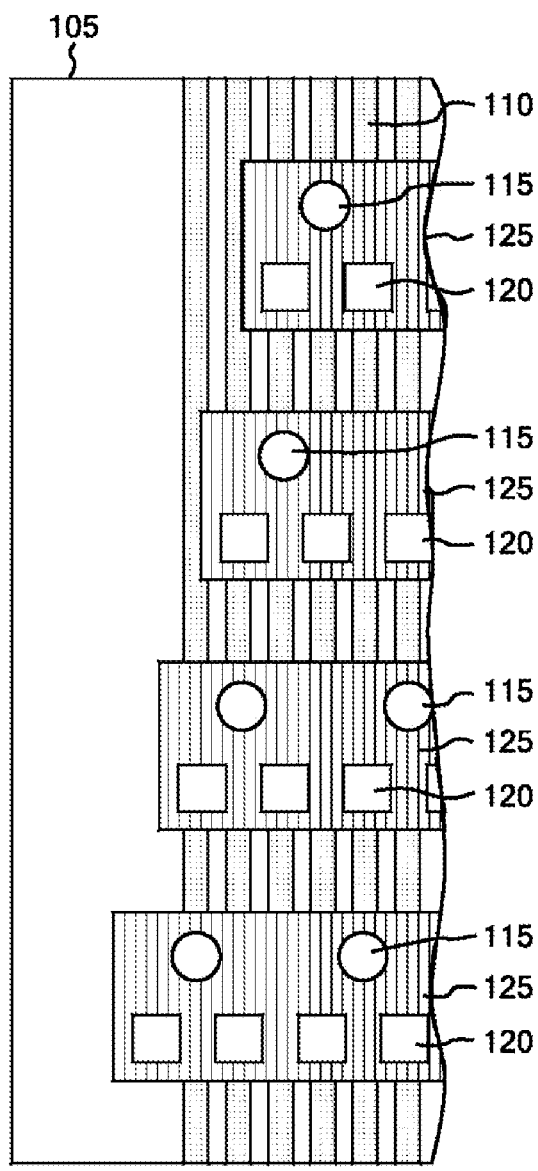
FIG. 1 (Prior Art) is a top view schematically illustrating a densified optical module using a spatial multiplexing scheme of the prior art.
Figure 2:
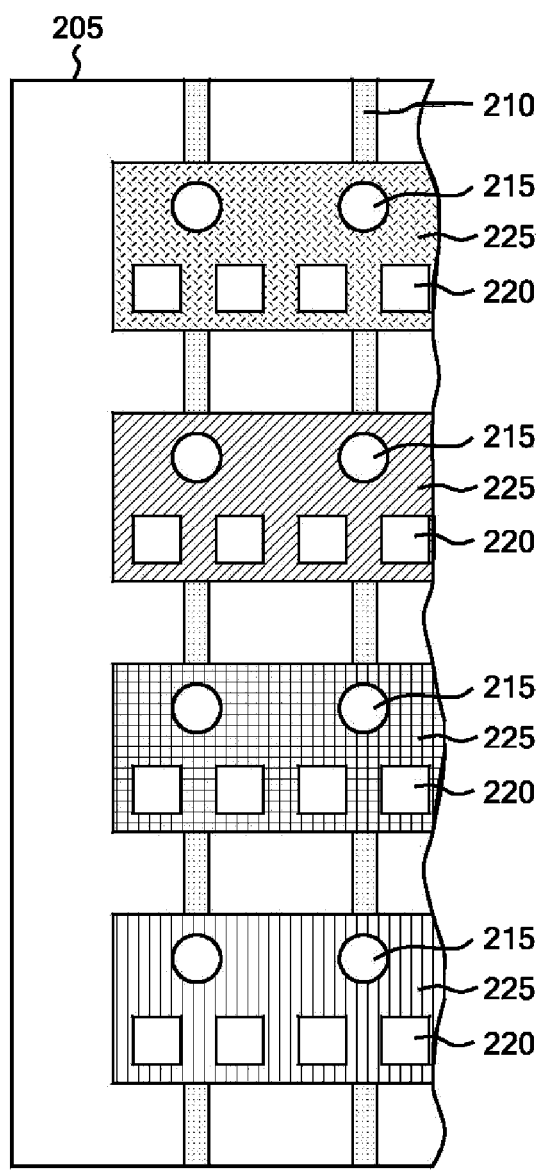
FIG. 2 is a top view schematically illustrating the structure of an optical module in an embodiment of the present invention.

FIG. 2 is a top view schematically illustrating the structure of an optical module 200 in an embodiment of the present invention. Compared to the optical module 100 in FIG. 1 (Prior Art), the optical waveguides 210 in this optical module 200 are arranged at appropriate intervals on the obverse surface of the substrate 205. Because optical signals multiplexed using four wavelengths are propagated in a single optical waveguide 210 as shown in FIG. 2, the interval between optical waveguides 210 does not have to be narrowed to the interval of the optical waveguides 110 in the optical module 100 which propagate optical signals using a single wavelength.

The optical module 200 has four VCSEL/PD chips 225 for each optical waveguide 210. Because each VCSEL/PD chip 225 has a different wavelength, the optical waveguides 210 are provided side-by-side, and an optical input/output unit 215 is provided in parallel for each optical waveguide 210. As explained below, a groove is formed in each optical waveguide 210, and each optical input/output unit 215 is embodied by a light-selecting filter arranged in the groove. When the optical input/output units 115 are arranged side-by-side and separated by an interval, the grooves used to arrange the reflecting means on the optical waveguides 110 have to be formed individually using, for example, laser ablation. However, because the optical input/output units 215 are provided side-by-side in the optical module 200, the grooves used to arrange the light-selecting filters can be formed together using, for example, dicing. Two electric pads 220, an input pad and an output pad, are provided for each optical input/output unit 215 in each VCSEL/PD chip 225. Each electric pad 220 can be provided between optical waveguides 210 and not through the optical waveguides 210.

In the optical module 100 of FIG. 1 (Prior Art), in which optical signals are propagated using a single wavelength, four optical waveguides 110 are provided at a pitch of 62.5 μm and a width of 250 μm to realize four channels. In the optical module 200, in which optical signals multiplexed using four wavelengths are inputted and outputted, a single optical waveguide 210 is provided at a width of 250 μm to realize four channels. In the optical waveguide 200, the channel density limitations of the spatial multiplexing scheme can be overcome, the number of channels can be increased, and densification can be achieved. In addition, the formation of optical input/output units 215 is simpler, and the arrangement of VCSEL/PD pads 225 with electric pads 220 is easier.

Figure 3:
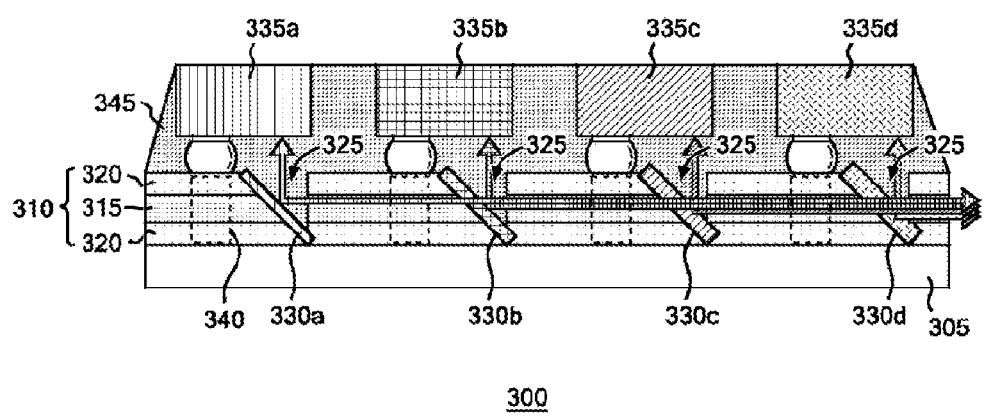
FIG. 3 is a cross-sectional view schematically illustrating the structure of an optical module in an embodiment of the present invention.

FIG. 3 is a cross-sectional view schematically illustrating the structure of an optical module 300 in another embodiment of the present invention. In optical module 300, the optical waveguides 310 are arranged on the obverse surface of the substrate 305 at the appropriate interval. The optical waveguides 310 are composed of a core 315 with a size of, for example, 35 μm, and a clad 320. A plurality of grooves 325 are provided in each optical waveguide 310 having a surface orthogonal with respect to and a surface inclined with respect to the obverse surface of the substrate 305. The number of grooves corresponds to the number of wavelengths used to multiplex optical signals. For example, four grooves 325 are formed in each optical waveguide 310 when optical signals are multiplexed using the 940 nm, 980 nm, 1020 nm and 1060 nm.

Four light-emitting and light-receiving elements corresponding to the light of the four different wavelengths, such as VCSEL/PD chips 335a (940 nm), 335b (980 nm), 335c (1020 nm) and 335d (1060 nm), are aligned on top of the optical waveguides 310 with the four grooves 325 in the optical waveguides 310. Four light-selecting filters are provided in the form of distributed Bragg reflector (DBR) filters 330a, 330b, 330c and 330d on the inclined surfaces of the four grooves 325. The four DBR filters 330a-330d reflect light of the corresponding wavelength from the VCSEL or light-emitting element of the corresponding VCSEL/PD chip 335a-335d towards the optical waveguide 310, and light of the corresponding wavelength is selected from the light propagating through the optical waveguide 310 and striking the orthogonal surface of the groove 325 and reflected towards the PD or light-receiving element of the corresponding VCSEL/PD chip 335a-335d.

More specifically, optical signals multiplexed using the 940 nm, 980 nm, 1020 nm and 1060 nm wavelengths are inputted. DBR filter 330d reflects light of the 1060 nm wavelength from the light propagating through the optical waveguide 310 from the right and striking the orthogonal surface of the groove 325, and allows light of the remaining 940 nm, 980 nm and 1020 nm wavelengths to pass through.

DBR filter 330c reflects light of the 1020 nm wavelength from the light propagating through the optical waveguide 310 from the right and striking the orthogonal surface of the groove 325, and allows light of the remaining 940 nm and 980 nm wavelengths to pass through. DBR filter 330b reflects light of the 980 nm wavelength from the light propagating through the optical waveguide 310 from the right and striking the orthogonal surface of the groove 325, and allows light of the remaining 940 nm wavelength to pass through. DBR filter 330a reflects light of the 940 nm wavelength from the light propagating through the optical waveguide 310 from the right and striking the orthogonal surface of the groove 325. Conversely, optical signals multiplexed using the 940 nm, 980 nm, 1020 nm and 1060 nm wavelengths are outputted.

DBR filter 330a reflects light of the 940 nm wavelength from VCSEL/PD chip 335a so as to be incident on the optical waveguide 310. DBR filter 330b allows light of the 940 nm wavelength propagating through the optical waveguide 310 from the left to pass, and reflects light of the 980 nm wavelength from VCSEL/PD chip 335b so light of the 940 nm and 980 nm wavelengths is incident on the optical waveguide 310. DBR filter 330c allows light of the 940 nm and 980 nm wavelengths propagating through the optical waveguide 310 from the left to pass, and reflects light of the 1020 nm wavelength from VCSEL/PD chip 335c so light of the 940 nm, 980 nm and 1020 nm wavelengths is incident on the optical waveguide 310. DBR filter 330d allows light of the 940 nm, 980 nm and 1020 nm wavelengths propagating through the optical waveguide 310 from the left to pass, and reflects light of the 1060 nm wavelength from VCSEL/PD chip 335d so light of the 940 nm, 980 nm, 1020 nm and 1060 nm wavelengths is incident on the optical waveguide 310.

Wiring 340 is provided to electrically connect each of the VCSEL/PD chips 335a-335d, and the wiring 340 does not pass through the optical waveguides 310. Because the light propagating through the optical waveguides 310 passes through the orthogonal surfaces of the grooves 325, very little propagating light is reflected, and loss due to reflection can be minimized. Therefore, use of an optical filter such as non-reflective film is not required. The grooves 325 and the DBR filters 330a-330d are covered with an optically transparent underfill 345. When propagating light passes through the orthogonal surfaces of the grooves 325, the light is incident on the underfill 345 and not air, which suppresses the scattering of light and reduces loss.

Figure 4:
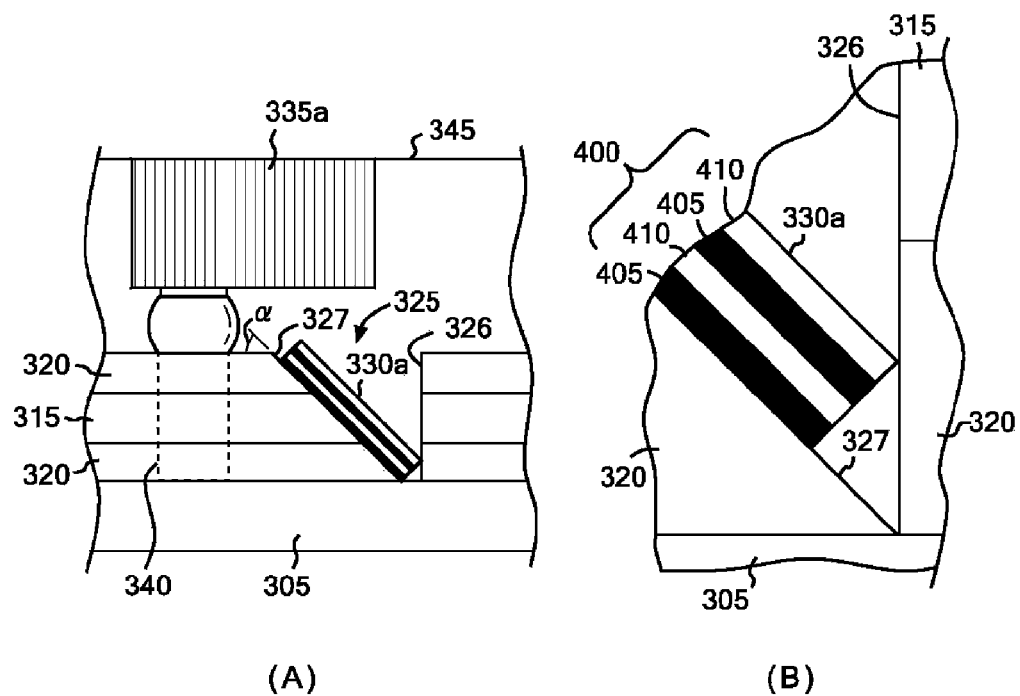
FIG. 4 (A) is an enlarged cross-sectional view of a portion of the structure in FIG. 3, and FIG. 4 (B) is a cross-sectional view of a portion of the structure in FIG. 4 (A).

FIG. 4 (A) shows an expanded cross-sectional view of a portion of the optical module 300 in FIG. 3. The groove 325 has an orthogonal surface 326 and an inclined surface 327 relative to the obverse surface of the substrate 305. The angle of incidence a of the inclined surface 327 is preferably 45 degrees. FIG. 4 (B) shows an enlarged cross-sectional view of FIG. 4 (A) including DBR filter 330a. As shown in FIG. 4 (B), the DBR filters 330a-330d are composed of multilayered film 400 composed of dielectric films 405 having a refractive index of n1 alternating with dielectric films 410 having a refractive index of n2. Wavelength dependency on reflectance develops at the interface between dielectric films 405 and dielectric films 410 due to interference of reflected multiplexed light. The wavelength dependency on reflectance can be changed by changing of thickness of each layer of dielectric film 405 and dielectric film 410. When the thickness of a layer is increased, a longer wavelength is reflected.

Figure 5:
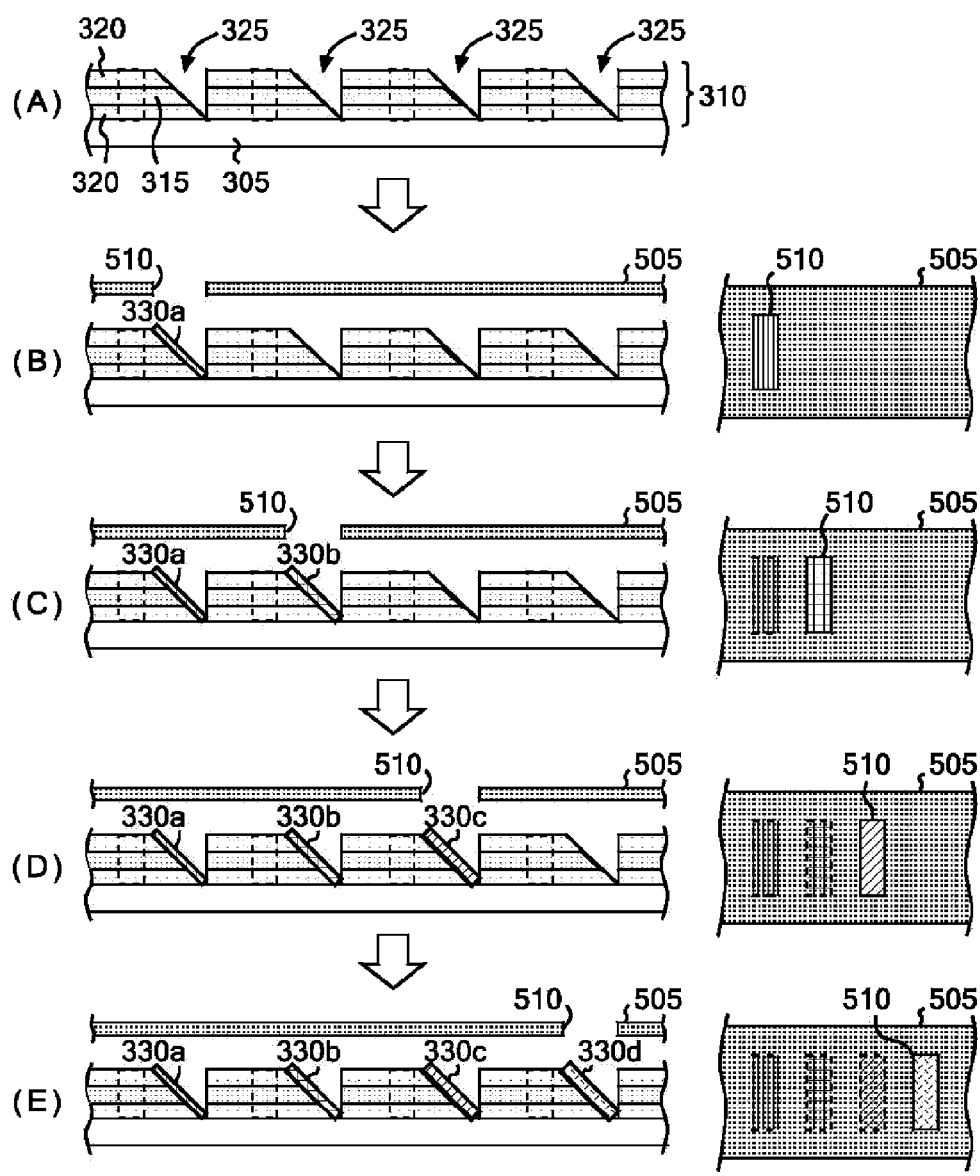
FIG. 5 (A) through FIG. 5 (E) are diagrams schematically illustrating the mask operations in a method for manufacturing an optical module in an embodiment of the present invention.

FIG. 5 (A) through FIG. 5 (E) are diagrams schematically illustrating the mask operations in a method for manufacturing an optical module in an embodiment of the present invention. A cross-sectional view is shown on the left and a top view of the mask is shown in the right. In FIG. 5 (A), four grooves 325 composed of a surface orthogonal with respect to and a surface inclined with respect to the obverse surface of the substrate 305 in at least one optical waveguide 310 provided on the obverse surface of the substrate 305. Preferably, the inclined surface of the grooves 325 is inclined by 45 degrees. In FIG. 5 (B) through FIG. 5 (E), DBR filters 330a-330d, or four light-selecting filters used to reflect light of the corresponding wavelengths among the four different wavelengths, are formed on the inclined surfaces of four grooves 325.

In FIG. 5 (B), a mask 505 with one opening 510 corresponding to the size of the grooves 325 is used to form DBR filter 330a. The mask is aligned with the groove 325 in which DBR filter 330a is to be formed, and DBR filter 330a is vapor-deposited on the inclined surface of the groove 325. During vapor deposition, the entire unit is tilted slightly so that the dielectric film of the DBR filter is not deposited on the surface orthogonal to the groove 325. In FIG. 5 (C), the mask 505 is moved to align the opening 510 with the groove 325 in which DBR filter 330b is to be formed, and DBR filter 330b is vapor-deposited on the inclined surface of the groove 325. In FIG. 5 (D), the mask 505 is moved to align the opening 510 with the groove 325 in which DBR filter 330c is to be formed, and DBR filter 330c is vapor-deposited on the inclined surface of the groove 325. In FIG. 5 (E), the mask 505 is moved to align the opening 510 with the groove 325 in which DBR filter 330d is to be formed, and DBR filter 330d is vapor-deposited on the inclined surface of the groove 325.

Although not shown in FIG. 5, four VCSEL/PD chips 335a-335d or four pairs of light-emitting and light-receiving elements corresponding to the light of the four different wavelengths are preferably provided on the optical waveguide 310 so as to be aligned with the four grooves 325 of the optical waveguide.

Figure 6:
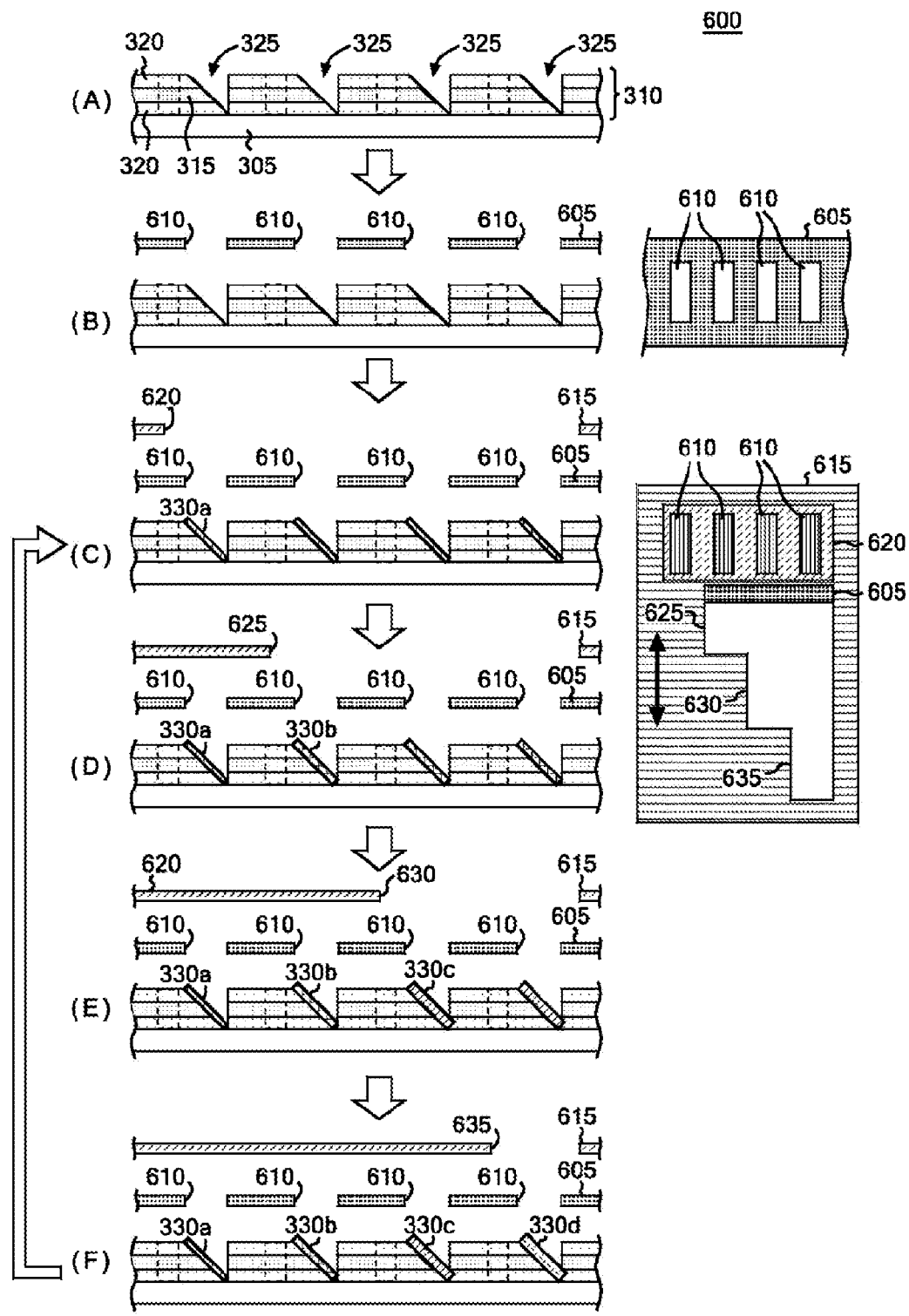
FIG. 6 (A) through FIG. 6 (F) are diagrams schematically illustrating other mask operations in a method for manufacturing an optical module in an embodiment of the present invention.

FIG. 6 (A) through FIG. 6 (F) are diagrams schematically illustrating other mask operations in a method for manufacturing an optical module in an embodiment of the present invention. Cross-sectional views are shown on the left, and top views of the mask are shown on the right. In FIG. 6 (A), as in FIG. 5, four grooves 325 composed of a surface orthogonal with respect to and a surface inclined with respect to the obverse surface of the substrate 305 in at least one optical waveguide 310 provided on the obverse surface of the substrate 305. Preferably, the inclined surface of the grooves 325 is inclined by 45 degrees. In FIG. 6 (B) through FIG. 6 (F), DBR filters 330a-330d, or four light-selecting filters used to reflect light of the corresponding wavelengths among the four different wavelengths, are formed on the inclined surfaces of four grooves 325.

In FIG. 6 (B), a first mask 605 in which four openings 610 of the proper size are formed so as to be aligned with each of the four grooves 325 is aligned and fixed so that the four openings 610 are properly aligned with the four grooves 325. In FIG. 6 (C), a second mask 615, in which a plurality of openings of different sizes are formed so that the largest opening 620 covers all four grooves 325 and each of three smaller openings 625, 630, 635 covers one less groove 325, so that the smallest opening 635 covers only one groove 325, is placed on top of the fixed first mask 605 so that all four openings 610 are aligned with the opening 620 in the second mask 615, and the dielectric film needed to form DBR filter 330a is vapor-deposited on the inclined surfaces of all four grooves 325. In FIG. 6 (D), the second mask 615 is moved so that the three remaining openings 610 are aligned with the opening 630 in the second mask 615 to cover the one opening 610 in the position where DBR filter 330a was formed in the fixed first mask 605, and the dielectric film needed to form DBR filter 330b is vapor-deposited on the inclined surfaces of the remaining three grooves 325. In FIG. 6 (E), the second mask 615 is moved so that the two remaining openings 610 are aligned with the opening 625 in the second mask 615 to cover the two openings 610 in the positions where DBR filters 330a-330b were formed in the fixed first mask 605, and the dielectric film needed to form DBR filter 330c is vapor-deposited on the inclined surfaces of the remaining two grooves 325. In FIG. 6 (F), the second mask 615 is moved so that the one remaining opening 610 is aligned with the opening 625 in the second mask 615 to cover the three openings 610 in the positions where DBR filters 330a-330c were formed in the fixed first mask 605, and the dielectric film needed to form DBR filter 330d is vapor-deposited on the inclined surfaces of the remaining one groove 325. The vapor deposition of the dielectric film in FIG. 6 (C) through FIG. 6 (F) is repeated to form the multilayered film 400 of DBR filters 330a-330d.

Figure 7:
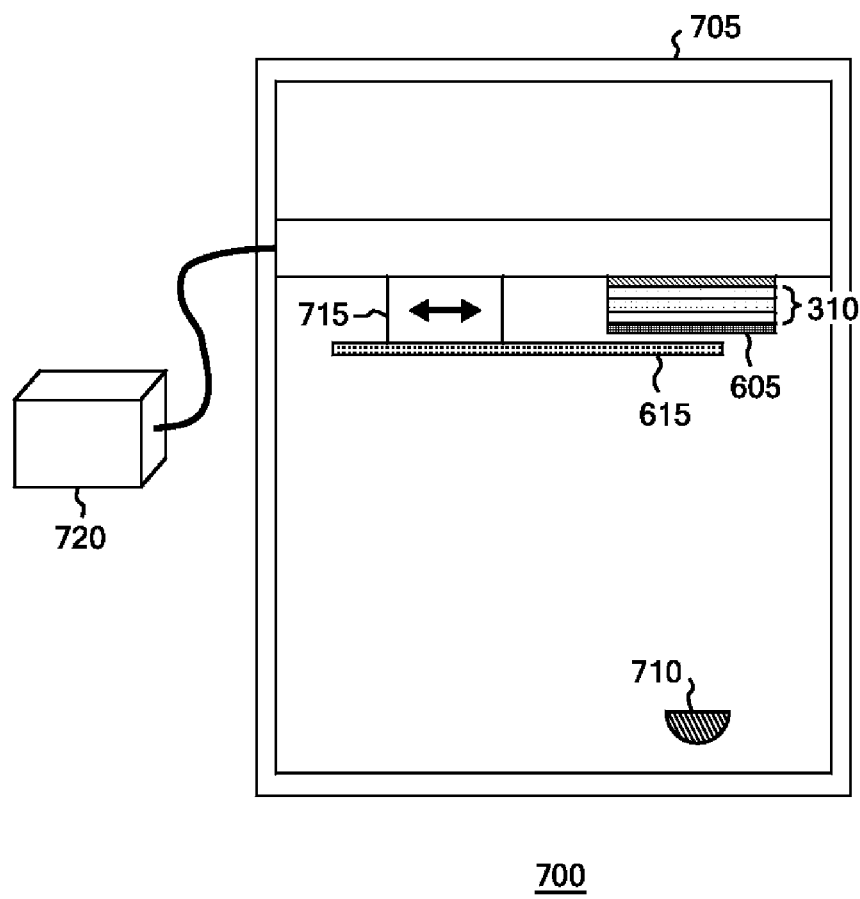
FIG. 7 is a diagram schematically illustrating a device used to embody the mask operations in FIG. 6.

FIG. 7 is a diagram schematically illustrating a device 700 used to embody the mask operations in FIG. 6. Deposition of the dielectric film is conducted inside a vacuum chamber 705. Inside the vacuum chamber 705, the dielectric material is discharged from the vapor deposition source 710 of the dielectric film onto the optical waveguide 310 positioned above. The second mask 615 is moved by an XY stage 715 to position the openings 620, 625, 630, 635 in the second mask 615 relative to the opening 610 in the first mask 605 vised on the optical waveguide 310. The XY stage 715 is controlled by the stage controller 720. The positioning of the opening 610 in the first mask 605 and the openings 620, 625, 630, 635 in the second mask 615 is performed by controlling the XY stage 715 using a stage controller 720. In this way, the alignment can be performed quickly, deposition of the dielectric film can be repeated efficiently, and the multilayered film 400 of the DBR filters 330a-330d can be formed.

Figure 8:
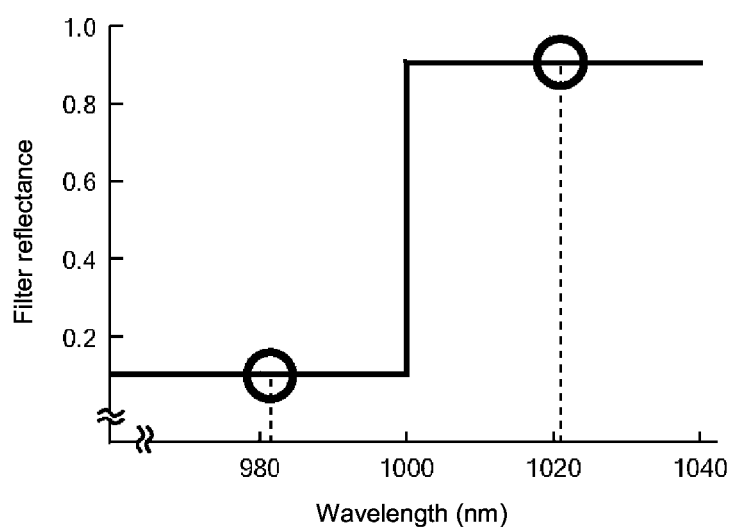
FIG. 8 is a graph showing the relationship between reflectance and the wavelengths of distributed Bragg reflector (DBR) filters used in an optical module related to an embodiment of the present invention.

FIG. 8 is a graph showing the relationship between reflectance and the wavelengths of the DBR filters 330a-330d used in optical module 300. The characteristics of the DBR filters 330a-330d are illustrated in the examples so that the reflectance is high in the vicinity of a specific wavelength and the reflectance becomes lower in other wavelength regions. However, filters with high reflectance at a specific wavelength are structured so that light with a longer wavelength does not pass through. As shown in FIG. 8, the filter characteristics have a step near the 1000 nm boundary between the wavelengths that are used, and the reflectance is higher as the wavelength becomes longer and the reflectance is lower as the wavelength becomes shorter. In an example featuring the opposite VCSEL/PD chip arrangement, the filter characteristics have to be reversed, and the reflectance is lower as the wavelength becomes longer and the reflectance is higher as the wavelength becomes shorter.

Figure 9:
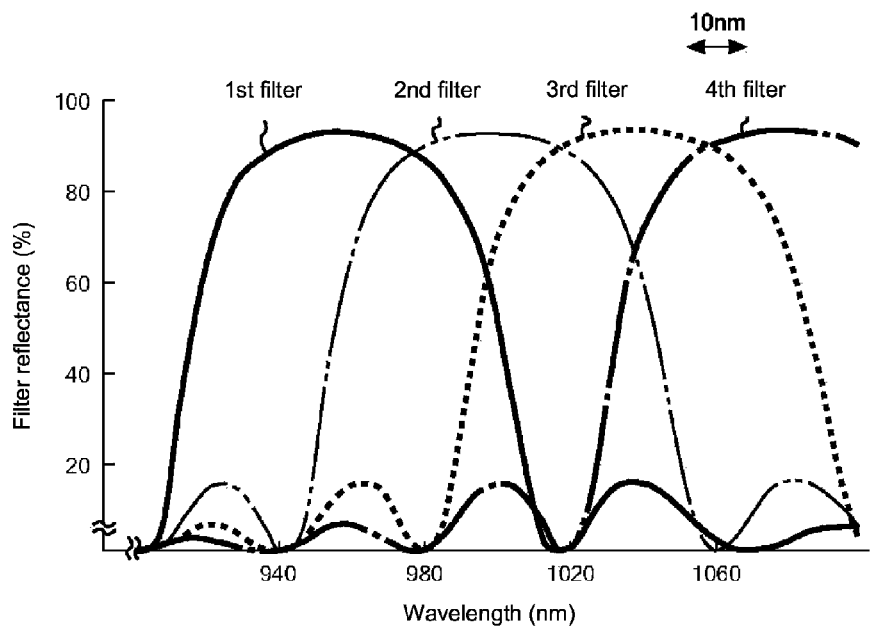
FIG. 9 is a graph showing an example of loss due to the reflection and transmission of light by the DBR filters used in an optical module related to an embodiment of the present invention.

FIG. 9 is a graph showing an example of loss due to the reflection and transmission of light by the DBR filters 330a-330d used in optical module 300. In this example, the light is S-polarized light. The first filter is DBR filter 330a (940 nm), the second filter is DBR filter 330b (980 nm), the third filter is DBR filter 330c (1020 nm), and the fourth filter is DBR filter 330d (1060 nm). The configuration of the DBR filters is a multilayered film structure with 20 pairs of dielectric film. An example of a dielectric pair is dielectric film of $MgF_2$ (magnesium fluoride) with a refractive index of 1.38 and a thickness 0.2608 times the wavelength of the light, and dielectric film of $SiO_2$ (silicon dioxide) with a refractive index of 1.45 and a thickness 0.2482 times the wavelength of the light.

As shown in the graph, the first filter is highly reflective in the 940 nm to 980 nm wavelength range and reflects light with a wavelength of 980 nm. However, light with a wavelength of 980 nm is reflected by the second filter and does not reach the first filter so it does not pose a problem operationally. The second filter is highly reflective in the 980 nm to 1020 nm wavelength range and reflects light with a wavelength of 1020 nm. However, light with a wavelength of 1020 nm is reflected by the third filter and does not reach the second filter so it does not pose a problem operationally. The third filter is highly reflective in the 1020 nm to 1060 nm wavelength range and reflects light with a wavelength of 1060 nm. However, light with a wavelength of 1060 nm is reflected by the fourth filter and does not reach the third filter so it does not pose a problem operationally.

For light with a wavelength of 940 nm, as shown in the table, loss at the first filter due to reflection is 0.6 dB, loss at the second filter due to transmission is 0.3 dB, loss at the third filter due to transmission is 0.1 dB, and loss at the fourth filter due to transmission is 0.0 dB for a total loss of 1.0 dB. For light with a wavelength of 980 nm, there is no loss at the first filter because the light does not reach the first filter. Loss at the second filter due to reflection is 0.4 dB, loss at the third filter due to transmission is 0.3 dB, and loss at the fourth filter due to transmission is 0.2 dB for a total loss of 0.9 dB. For light with a wavelength of 1020 nm, there is no loss at the first and second filters because the light does not reach the first and second filters. Loss at the third filter due to reflection is 0.4 dB, and loss at the fourth filter due to transmission is 0.5 dB for a total loss of 0.9 dB. For light with a wavelength of 1060 nm, there is no loss at the first, second and third filters because the light does not reach the first, second and third filters. Loss at the fourth filter due to reflection is 0.6 dB for a total loss of 0.6 dB. In the case of S-polarized light, connection loss of 1 dB or less can be realized in four-wavelength multiplexing.

Figure 10:
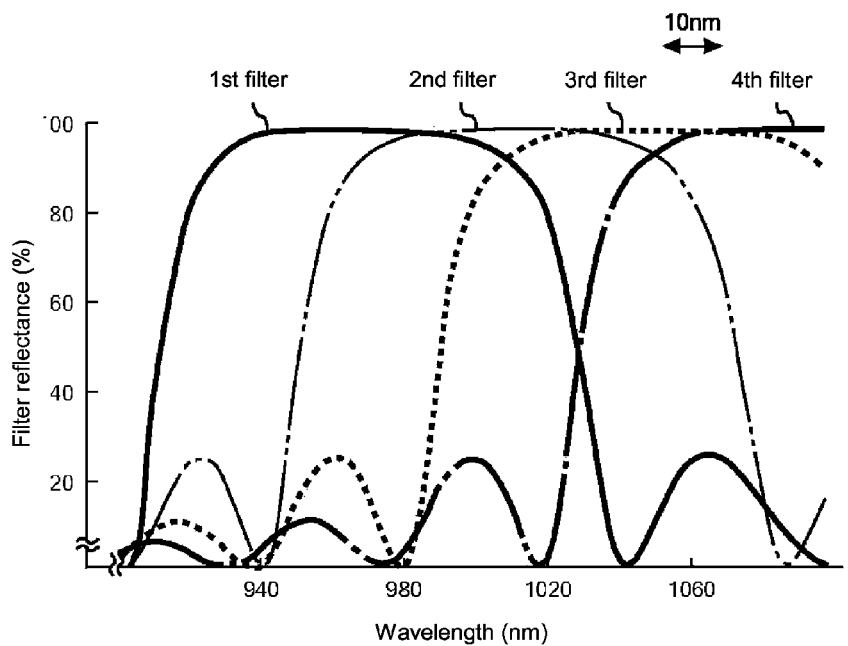
FIG. 10 is a graph showing another example of loss due to the reflection and transmission of light by the DBR filters used in an optical module related to an embodiment of the present invention.

FIG. 10 is a graph showing another example of loss due to the reflection and transmission of light by the DBR filters 330a-330d used in optical module 300. In this example, the light is P-polarized light. The first filter is DBR filter 330a (940 nm), the second filter is DBR filter 330b (980 nm), the third filter is DBR filter 330c (1020 nm), and the fourth filter is DBR filter 330d (1060 nm). The configuration of the DBR filters is a multilayered film structure with 18 pairs of dielectric film. An example of a dielectric pair is dielectric film of $MgF_2$ (magnesium fluoride) with a refractive index of 1.38 and a thickness 0.2641 times the wavelength of the light, and dielectric film of MgO (magnesium oxide) with a refractive index of 1.74 and a thickness 0.2095 times the wavelength of the light.

As shown in the graph, the first filter is highly reflective in the 940 nm to 1020 nm wavelength range and reflects light with a wavelength of 980 nm and 1020 nm. However, light with a wavelength of 980 nm and light with a wavelength of 1020 nm is reflected by the second and third filters and does not reach the first filter so it does not pose a problem operationally. The second filter is highly reflective in the 980 nm to 1060 nm wavelength range and reflects light with a wavelength of 1020 and 1060 nm. However, light with a wavelength of 1020 nm and 1060 nm is reflected by the third and fourth filters and does not reach the second filter so it does not pose a problem operationally. The third filter is highly reflective in the 1020 nm to 1080 nm wavelength range and reflects light with a wavelength of 1060 nm. However, light with a wavelength of 1060 nm is reflected by the fourth filter and does not reach the third filter so it does not pose a problem operationally.

For light with a wavelength of 940 nm, as shown in the table, loss at the first filter due to reflection is 0.3 dB, loss at the second filter due to transmission is 0.6 dB, loss at the third filter due to transmission is 0.1 dB, and loss at the fourth filter due to transmission is 0.0 dB for a total loss of 1.0 dB. For light with a wavelength of 980 nm, there is no loss at the first filter because the light does not reach the first filter. Loss at the second filter due to reflection is 0.2 dB, loss at the third filter due to transmission is 0.3 dB, and loss at the fourth filter due to transmission is 0.3 dB for a total loss of 0.8 dB. For light with a wavelength of 1020 nm, there is no loss at the first and second filters because the light does not reach the first and second filters. Loss at the third filter due to reflection is 0.2 dB, and loss at the fourth filter due to transmission is 0.6 dB for a total loss of 0.8 dB. For light with a wavelength of 1060 nm, there is no loss at the first, second and third filters because the light does not reach the first, second and third filters. Loss at the fourth filter due to reflection is 0.3 dB for a total loss of 0.3 dB. In the case of P-polarized light, connection loss of 1 dB or less can be realized in four-wavelength multiplexing.

The present invention was explained above using the embodiment, but the technical scope of the present invention is not limited in any way by the embodiment. It should be clear to a person of skill in the art that various modifications and substitutions can be made without departing from the spirit and scope of the present invention.

What is claimed is:

1. An optical module comprising:
   at least one optical waveguide provided on an obverse surface of a substrate, wherein the at least one optical waveguide propagates four optical signals;
   a plurality of grooves provided in the at least one optical waveguide on the surface of the substrate and having both a surface orthogonal to the surface of the substrate and an inclined surface;
   a plurality of pairs of light-emitting and light-receiving elements aligned with the plurality of grooves in the optical waveguide and provided so as to correspond to light of different wavelengths on the at least one optical waveguide; and
   a plurality of light-selecting filters each provided on the inclined surface of the plurality of grooves in the optical waveguide and reflecting light of a wavelength corresponding to the light-emitting element in a respective pair of light-emitting and light-receiving elements towards the optical waveguide, and selectively reflecting light of the corresponding wavelength from the light propagating through the optical waveguide towards the corresponding pair of light-emitting and light-receiving elements; and
   the optical module is formed using a device comprising:
   a vacuum chamber including a vapor deposition source;
   a first mask and a second mask, wherein the first mask and the second mask each have at least one opening; and a stage controller, wherein the stage controller controls a position of the second mask relative to the first mask in an X-Y stage in the vacuum chamber over the optical module.

2. The optical module according to claim 1, wherein the light of a plurality of different wavelengths comprises light of different wavelengths having a wavelength spacing of at least 25 nm.

3. The optical module according to claim 1, wherein the inclined surfaces are surfaces inclined at 45 degrees relative to the surface of the substrate.

4. The optical module according to claim 1, wherein the light-selecting filters are distributed Bragg reflectors (DBR).

5. The optical module according to claim 1, wherein each of the plurality of pairs of light-emitting and light-receiving elements is provided so as to face a reflective surface of the corresponding light-selecting filter.

6. The optical module according to claim 1, wherein the plurality of grooves and the plurality of light-selecting filters are covered by an optically transparent underfill.

7. The optical module according to claim 1, wherein a number of the plurality of grooves corresponds to a number of wavelengths used to multiplex optical signals.

8. The optical module according to claim 1, wherein the light-selecting filters are composed of one or more dielectric film layers.

9. The optical module according to claim 8, wherein a first dielectric film layer has a first refractive index, and wherein a second dielectric film layer has a second refractive index, and the first and the second dielectric film layers alternate.

10. The optical module according to claim 1, wherein four optical signals, each of a different wavelength, are inputted.

11. A method for manufacturing an optical module comprising:
    forming a plurality of grooves in at least one optical waveguide provided on a surface of a substrate, each groove having a surface orthogonal with respect to and a surface inclined at 45 degrees with respect to the surface of the substrate, and wherein the formation of the plurality of grooves are formed together, by dicing;
    forming a plurality of light-selecting filters for reflecting light of a wavelength corresponding to light of different wavelengths on the corresponding inclined surfaces of the plurality of grooves, wherein the formation of the light selecting filters further comprises:
    using a device comprising a first mask and a second mask, wherein the first mask and the second mask each have at least one opening, and a stage controller, wherein the stage controller controls a position of the second mask relative to the first mask in an X-Y stage in a vacuum chamber over the optical module; and
    discharging, in the vacuum chamber, a dielectric material, from a vapor disposition source, wherein the dielectric material is discharged onto the optical module to form a film, wherein the film comprises at least one layer.

12. The method for manufacturing an optical module according to claim 11 further comprising providing a plurality of pairs of light-emitting and light-receiving elements aligned with the plurality of grooves in the optical waveguide and corresponding to light of different wavelengths on the optical waveguide.

13. The method for manufacturing an optical module according to claim 11, wherein formation of a plurality of light-selecting filters on the corresponding inclined surface of the plurality of grooves involves the formation of a plurality of distributed Bragg reflectors (DBR) on the corresponding inclined surfaces of the plurality of grooves.

14. The method for manufacturing an optical module according to claim 13, wherein formation of a plurality of distributed Bragg reflectors (DBR) on the corresponding inclined surfaces of the plurality of grooves is performed by using a mask having one opening formed to the size of each of the plurality of grooves, the opening in the mask being aligned successively with each of the plurality of grooves, and a DBR filter vapor-deposited on the inclined surfaces of the plurality of grooves.

15. The method for manufacturing an optical module according to claim 13, wherein formation of the plurality of DBR filters on the corresponding inclined surfaces of the plurality of grooves is performed using a first mask having a plurality of openings aligned with and sized according to each of the plurality of grooves, and a second mask having a plurality of openings of different sizes formed so that a largest opening covers each of the plurality of grooves and each smaller opening covers one less groove, so that a smallest opening covers only one groove, each of the plurality of openings in the first mask being aligned with and fixed to one of the plurality of grooves, each of the plurality of openings in the second mask being moved successively and aligned one at a time with each of the plurality of openings in the first mask, and a DBR filter being vapor-deposited on each inclined surface of the plurality of grooves.

16. The method for manufacturing an optical module according to claim 11, wherein formation of the light-selecting filters on the corresponding inclined surfaces of the plurality of grooves further comprises deposition of a dielectric film, wherein the deposition is repeated to form one or more dielectric film layers.

17. A method for manufacturing an optical module comprising:
forming a plurality of grooves in at least one optical waveguide provided on a surface of a substrate, each groove having a surface orthogonal with respect to and a surface inclined with respect to the surface of the substrate;
forming a plurality of light-selecting filters for reflecting light of a wavelength corresponding to light of different wavelengths on the corresponding inclined surfaces of the plurality of grooves, wherein the plurality light-selecting filters are not deposited on a surface orthogonal to the plurality of grooves, and wherein the formation of the light selecting filters further comprises:
using a device comprising a first mask and a second mask, wherein the first mask and the second mask each have at least one opening, and a stage controller, wherein the stage controller controls a position of the second mask relative to the first mask in an X-Y stage in a vacuum chamber over the optical module;
tilting the optical module; and
discharging, in a vacuum chamber, a dielectric material, from a vapor disposition source, wherein the dielectric material is discharged onto the optical module to form a film, wherein the film comprises at least one layer.

18. The method for manufacturing an optical module according to claim 17 further comprising providing a plurality of pairs of light-emitting and light-receiving elements aligned with the plurality of grooves in the optical waveguide and corresponding to light of different wavelengths on the optical waveguide.

19. The method for manufacturing an optical module according to claim 17, wherein formation of a plurality of light-selecting filters on the corresponding inclined surface of the plurality of grooves involves the formation of a plurality of distributed Bragg reflectors (DBR) on the corresponding inclined surfaces of the plurality of grooves.

20. The method for manufacturing an optical module according to claim 19, wherein formation of a plurality of distributed Bragg reflectors (DBR) on the corresponding inclined surfaces of the plurality of grooves is performed by using a mask having one opening formed to the size of each of the plurality of grooves, the opening in the mask being aligned successively with each of the plurality of grooves, and a DBR filter vapor-deposited on the inclined surfaces of the plurality of grooves.

* * * * *